(12) United States Patent
Wu et al.

(10) Patent No.: US 6,979,620 B1
(45) Date of Patent: Dec. 27, 2005

(54) METHOD FOR FABRICATING A FLASH MEMORY CELL

(75) Inventors: Chun-Pei Wu, Nan-Tao (TW);
Huei-Huarng Chen, Chang-Hua (TW);
Hong-Chi Chen, Kaohsiung (TW);
Hsuan-Ling Kao, Taipei (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 11/126,301

(22) Filed: May 11, 2005

(30) Foreign Application Priority Data

Dec. 24, 2004 (TW) .............................. 93140486 A

(51) Int. Cl.⁷ ........................................ H01L 21/8247
(52) U.S. Cl. ...................................................... 438/258
(58) Field of Search ................................ 438/257–267

(56) References Cited

U.S. PATENT DOCUMENTS 5,098,855 A * 3/1992 Komori et al. ............. 438/200

* cited by examiner

*Primary Examiner*—Richard A. Booth
(74) *Attorney, Agent, or Firm*—Genus Law Group; Raymond Ho

(57) ABSTRACT

A method for fabricating a flash memory cell is provided. After an ONO dielectric layer is formed on a first conductive layer over a tunnel oxide layer, a second conductive layer is formed on the ONO dielectric layer. Then, patterning the second conductive layer to form a periphery region comprising an exposed portion of a semiconductor substrate and a memory cell region comprising the left second conductive layer. During the present process, the ONO dielectric layer is protected from being exposed in various solvents and gases with the second conductive layer. Thus, a flash memory cell with a high-quality ONO gate dielectric layer, without increasing complexity of the process and additional masks, is obtained.

16 Claims, 5 Drawing Sheets

METHOD FOR FABRICATING A FLASH MEMORY CELL

BACKGROUND OF THE INVENTION

1. Field of the Invention

The present invention relates to a method for fabricating a non-volatile memory cell, and more particularly to a method for fabricating a flash memory cell.

2. Description of the Prior Art

With enlargement of an application field such as a portable telephone and digital still camera, an EEPROM (Electrically Erasable and Programmable Read Only Memory) has rapidly come into wide use. The EEPROM, which permits electrical simultaneous erase of data, is called a flash EEPROM.

The EEPROM is a non-volatile semiconductor memory device which stores digital information with two or more values according to whether or not a prescribed quantity of charges is stored and reads the digital information by a change in the conduction of a channel region corresponding to the quantity of charges.

For the conventional flash EEPROM device, each memory cell is based on a MOS transistor element (called a floating-gate transistor) composed of a tunnel oxide layer, a floating gate, a gate dielectric layer with an oxide/nitride/oxide (ONO) structure, a control gate, a source region and a drain region. The floating gate is so named due to the fact that it is physically but not electrically isolated from all the other conductive elements in the flash EEPROM device. The floating gate is located beneath the control gate and isolated by the gate dielectric layer from the control gate. The control gate is electrically connected to one word line of the flash EEPROM device.

However, in the conventional method for fabricating a flash EEPROM cell, after the ONO gate dielectric layer is deposited, a first polysilicon layer and the tunnel oxide layer on the periphery region are removed by patterning the ONO gate dielectric layer with a photolithography and etching method. Then, a gate oxide layer and a second polysilicon layer are formed on the periphery region and on the ONO gate dielectric layer of a memory cell region. As a consequence, the ONO gate dielectric layer is exposed in various solvents and gases. For example, the ONO gate dielectric layer would be exposed in an acidic solution for stripping a photoresist, a purified purge gas/or a purified solvent used in surface clean process and $H_2O$/or oxygen gas used in a thermal oxidation for the formation of the gate oxide layer of the periphery region. Thus, many adverse effects are caused on the ONO gate dielectric layer.

Moreover, in order to prevent the loss of the ONO gate dielectric layer, the surface clean process prior to the formation of the gate oxide layer of the periphery region is significantly limited. Hence, the gate oxide layer of the periphery region is also disadvantageously influenced.

Accordingly, it is an intention to provide a method for fabricating a flash memory cell with a high-quality gate dielectric layer, which can overcome the above drawbacks.

SUMMARY OF THE INVENTION

It is one objective of the present invention to provide a method for fabricating a flash memory cell with a high-quality gate dielectric layer without increasing complexity of process steps and additional masks.

It is another objective of the present invention to provide a method for fabricating a flash EEPROM cell with a stacked ONO dielectric layer, which can prevent the ONO dielectric layer from being exposed in various solvents and gases during the manufacturing process. Thus, a high-quality ONO gate dielectric layer can be obtained.

In order to achieve the above objectives, the present invention provides a method for fabricating a flash memory cell, which can provide a high-quality gate dielectric layer. A semiconductor substrate with a first conductivity is firstly provided. A tunnel oxide layer is formed on the semiconductor substrate. Then, a first conductive layer is formed on the tunnel oxide layer. The first conductive layer is patterned to form the floating gate. An insulating layer is formed on the first conductive layer. A second conductive layer is then formed on the insulating layer. The second conductive layer is patterned to form a periphery region on an exposed portion of the semiconductor substrate and a memory cell region on the second conductive layer left on the semiconductor substrate. A gate oxide layer is then formed on the exposed portion of the semiconductor substrate of the periphery region and on the second conductive layer of the memory cell region. A third conductive layer is formed on the gate oxide layer. Then, the third conductive layer is patterned to form a first gate electrode on the gate oxide layer of the periphery region and expose the gate oxide layer of the memory cell region. A pair of lightly doped drain regions with a second conductivity opposite to the first conductivity is formed beside the sidewall of the first gate electrode in the semiconductor substrate of the periphery region. A dielectric layer is formed on the first gate electrode of the periphery region and on the gate oxide layer of the memory cell region. Anisotropically etching the dielectric layer until exposing the second conductive layer of the memory cell region to form a spacer on the sidewall of the first gate electrode of the periphery region. A source/drain region with the second conductivity is formed adjacent to the lightly doped drain region. The second conductive layer, the insulating layer, the first conductive layer and the tunnel oxide layer of the memory cell region is then patterned to form a second gate electrode. The insulating layer is protected from being exposed in various solvents and gases with the second conductive layer during the present manufacturing process. Thus, a high-quality gate dielectric layer formed of the insulating layer is obtained.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE EMBODIMENT

The present invention provides a method for fabricating a flash memory cell, especially EEPROM, with a high-quality gate dielectric layer, without increasing complexity of manufacturing process and additional masks, in which a second conductive layer to be formed as a control gate of a flash EEPROM cell is directly formed on an insulating layer to be formed as an inter-poly dielectric layer of the flash EEPROM cell after the insulating layer formed on a first conductive layer to be formed as a floating gate of the flash EEPROM cell, and then sequentially performing photolithography and etching processes, surface clean processes and thermal oxidation, etc. to complete the manufacturing process of the present flash EEPROM cell. Under the protection of the second conductive layer, the insulating layer is prevented from being exposed in various solvents and gases, such as an acidic solution for stripping a photoresist, a purified purge gas and solvent for surface clean and $H_2O$/or oxygen gas for thermal oxidation. Thus, the insulating layer is not destroyed and lost during the manufacturing process, and a high-quality gate dielectric layer of the flash EEPROM cell is obtained.

The present method will be described in detail in accordance with one preferred embodiment of the present invention in the following.

The preferred embodiment is shown in FIGS. 1A to 1D and FIGS. 2A to 2E, in which FIGS. 1A to 1D are schematic cross-sectional views of various steps of forming a periphery region of a flash EEPROM cell and FIGS. 2A to 2E are schematic cross-sectional views of various steps of forming a memory cell region of the flash EEPROM cell.

Figure 1A:
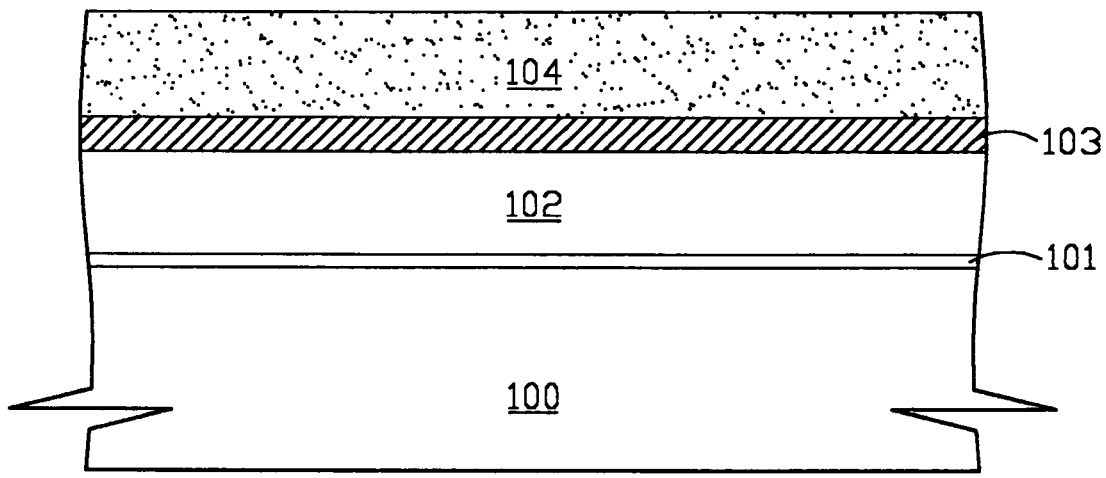
FIGS. 1A to 1D are schematic cross-sectional views of various steps of forming a periphery region of a flash EEPROM cell according to one preferred embodiment of the present invention.
Figure 2A:
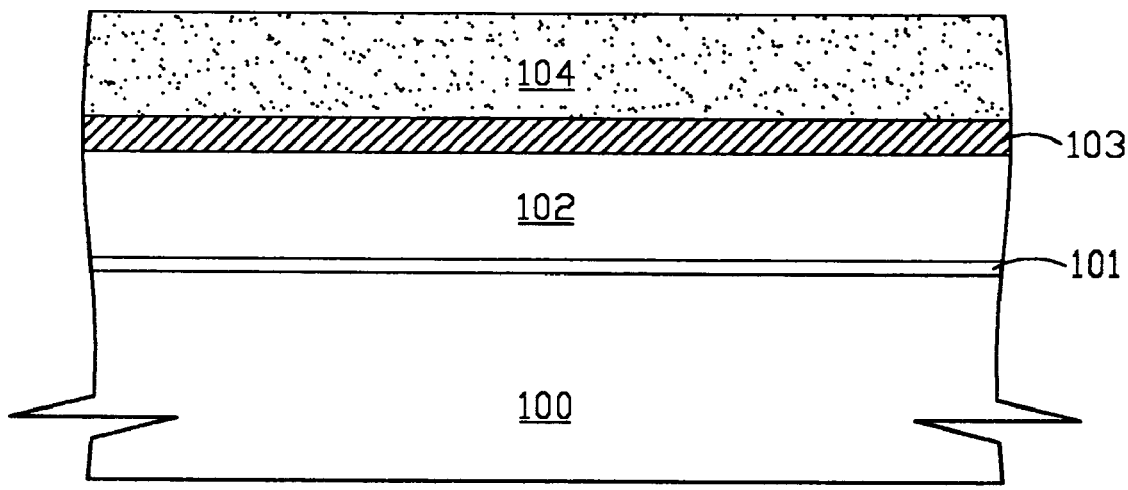
FIGS. 2A to 2E are schematic cross-sectional views of various steps of forming a memory cell region of a flash EEPROM cell according to the preferred embodiment of the present invention.

Referring to FIGS. 1A and 2A, a tunnel oxide layer 101 is formed on a semiconductor substrate 100 with a first conductivity. The semiconductor substrate 100 can be a P type or N type substrate, preferably a P type single crystal silicon substrate. The tunnel oxide layer 101 can be formed by oxidizing the surface of the silicon substrate at an elevated temperature in the presence of dry molecular oxygen. A first conductive layer 102 is then formed on the tunnel oxide layer 100, preferably a first polysilicon layer is formed on the tunnel oxide layer 101 by a low pressure chemical vapor deposition method with $SiH_4$ as a reaction gas at a temperature about 600~650° C. Sequentially, an insulating layer 103 is formed on the first conductive layer 102. It is preferable that the insulating layer 103 is a stacked ONO (oxide/nitride/oxide) dielectric layer by sequentially stacking a lower silicon dioxide layer, an intermediate silicon nitride layer and an upper second silicon dioxide layer on the first conductive layer 102. The lower silicon dioxide layer can be deposited on the first conductive layer 102 by a conventional chemical vapor deposition method with a thickness about 50 angstroms. The intermediate silicon nitride layer can be deposited following with a thickness about 80 angstroms by a low pressure chemical vapor deposition method with reaction gases of $SiH_2Cl_2$ and $NH_3$ at a temperature about 700~800° C. Then, the upper silicon dioxide layer is deposited on the intermediate silicon nitride layer with a thickness about 40 angstroms by a conventional chemical vapor deposition method. Thereafter, a second conductive layer 104 is formed on the insulating layer 103, preferably a second polysilicon layer is formed on the insulating layer 103 by a low pressure chemical vapor deposition method with $SiH_4$ as a reaction gas at a temperature about 600~650° C.

Figure 1B:
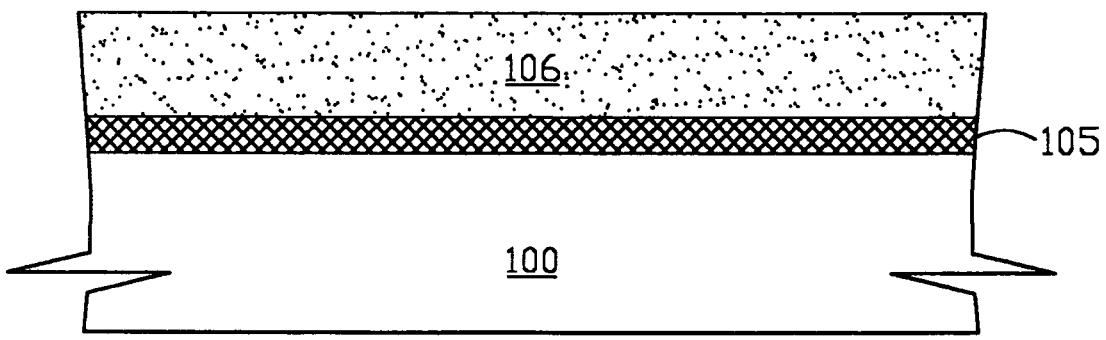
Figure 2B:
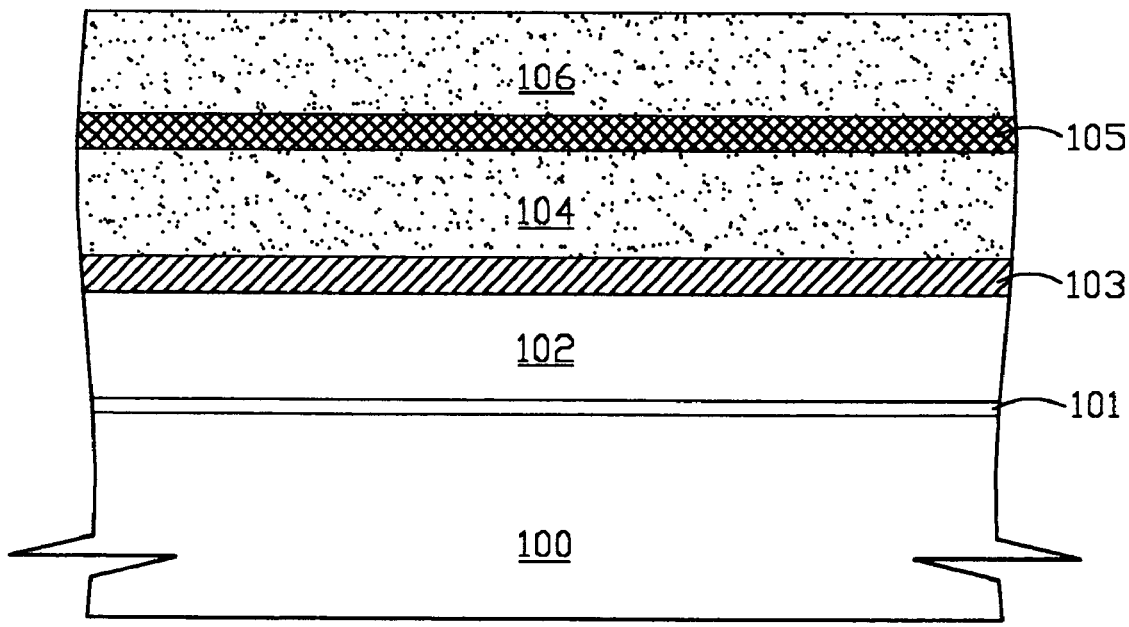

Referring to FIGS. 1B and 2B, next, patterning the second conductive layer 104 by a conventional photolithography and etching method to form a periphery region on an exposed portion of the semiconductor substrate 100, as shown in FIG. 1B and a memory cell region on the second conductive layer 104 left on the semiconductor substrate 100, as shown in FIG. 2B. A gate oxide layer 105 is then formed on the exposed portion of the semiconductor substrate 100 of the periphery region and the second conductive layer 104 of the memory cell region with a thermal oxidation process. A third conductive layer 106 is formed on the gate oxide layer 105, preferably a third polysilicon layer is formed on the gate oxide layer 105 by a low pressure chemical vapor deposition method with $SiH_4$ as a reaction gas at a temperature about 600~650° C.

Figure 1C:
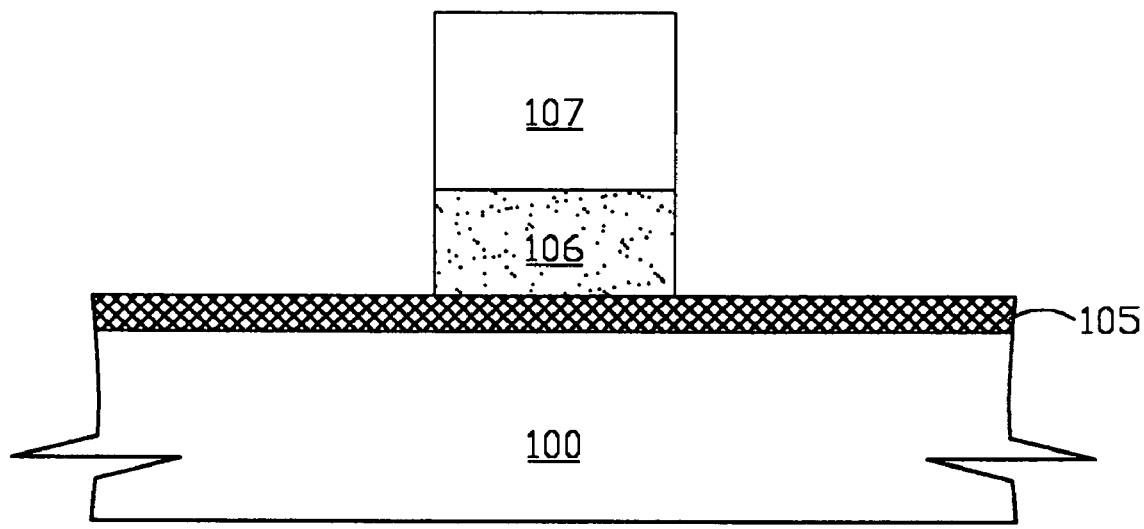
Figure 2C:
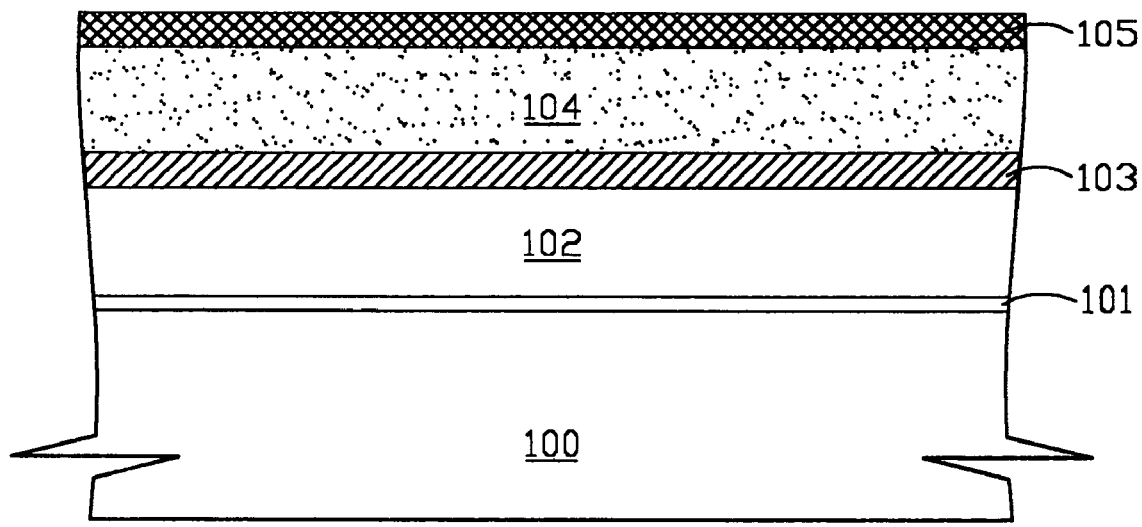

Referring to FIGS. 1C and 2C, forming a photoresist layer 107 over the semiconductor substrate 100, then patterning the third conductive layer 106 by a conventional photolithography and etching method to form a first gate electrode on the gate oxide layer 105 of the periphery region, as shown in FIG. 1C and expose the gate oxide layer 105 of the memory cell region, as shown in FIG. 2C. Then, the photoresist layer 107 is stripped.

Figure 1D:
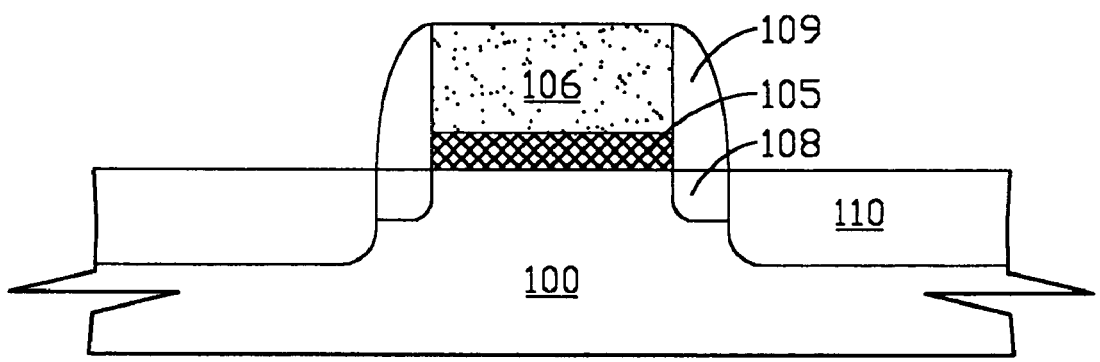
Figure 2D:
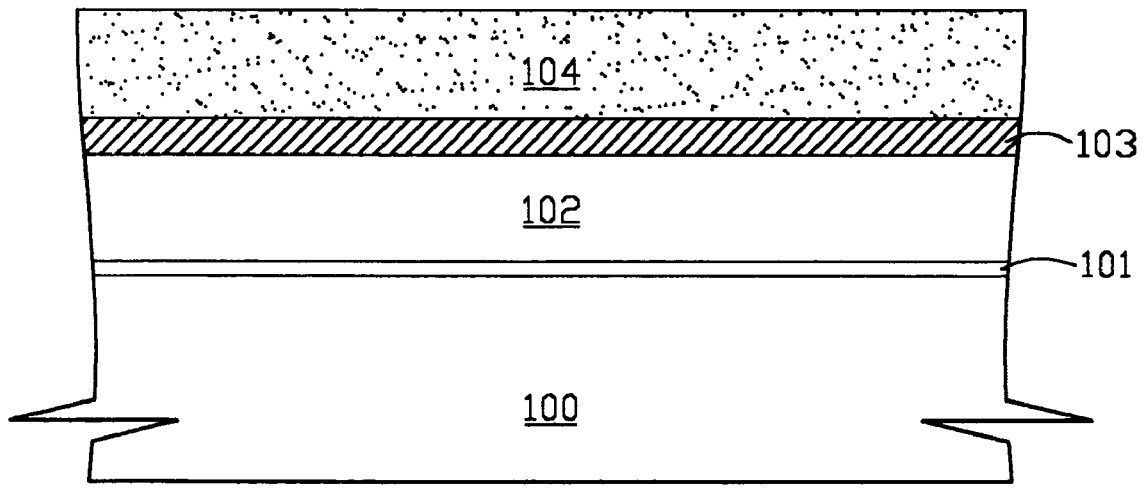
Figure 2E:
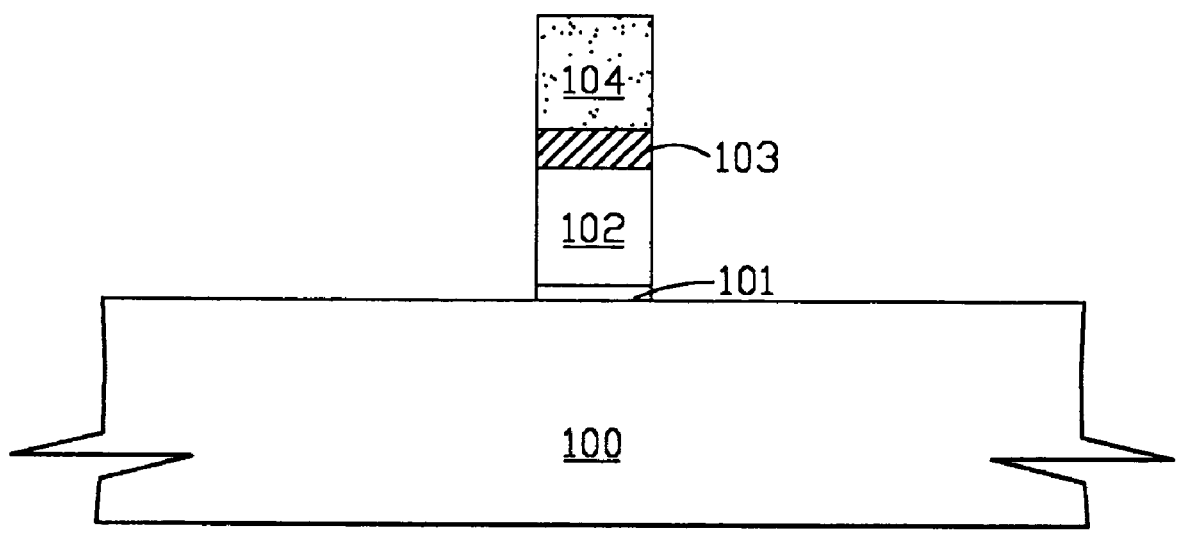

Referring to FIGS. 1D and 2D, performing ion implantation to form a lightly doped drain region 108 with a second conductivity opposite to the first conductivity beside the sidewall of the first gate electrode in the semiconductor substrate 100 of the periphery region, as shown in FIG. 1D. Afterward, a dielectric layer 109 is formed on the first gate electrode of the periphery region and the gate oxide layer 105 of the memory cell region, preferably a silicon dioxide layer is deposited by a low pressure chemical vapor deposition method with a reaction gas of TEOS (tetra-ethyl-ortho-silicate) at a temperature about 650~850° C. Anisotropically etching the dielectric layer 109 until exposing the second conductive layer 104 of the memory cell region, and thus forming a spacer on the sidewall of the first gate electrode of the periphery region, as shown in FIG. 1D. Then, performing ion implantation to form a source/drain region 110 with the second conductivity adjacent to the lightly doped drain region 108. Referring to FIG. 2E, then, patterning the second conductive layer 104, the insulating layer 103, the first conductive layer 102 and the tunnel oxide layer 101 to form a second gate electrode on the memory cell region, which is to be used as a flash EEPROM cell.

The preferred embodiment is only used to illustrate the present invention, not intended to limit the scope thereof. Many modifications of the preferred embodiment can be made without departing from the spirit of the present invention.

What is claimed is:

1. A method for fabricating a flash memory cell, comprising:

providing a semiconductor substrate with a first conductivity;

forming a tunnel oxide layer on said semiconductor substrate;

forming a first conductive layer on said tunnel oxide layer;

forming an insulating layer on said first conductive layer;

forming a second conductive layer on said insulating layer;

patterning said second conductive layer to form a periphery region on an exposed portion of said semiconductor substrate and a memory cell region on said second conductive layer left on said semiconductor substrate;

forming a gate oxide layer on the exposed portion of said semiconductor substrate of said periphery region and on said second conductive layer of said memory cell region;

forming a third conductive layer on said gate oxide layer;

patterning said third conductive layer to form a first gate electrode on said gate oxide layer of said periphery region and expose said gate oxide layer of said memory cell region;

forming a pair of lightly doped drain regions with a second conductivity opposite to said first conductivity beside the sidewall of said first gate electrode in said semiconductor substrate of said periphery region;

forming a dielectric layer on said first gate electrode of said periphery region and on said gate oxide layer of said memory cell region;

anisotropically etching said dielectric layer until exposing said second conductive layer of said memory cell region to form a spacer on the sidewall of said first gate electrode of said periphery region;

forming a source/drain region with said second conductivity adjacent to said lightly doped drain region; and patterning said second conductive layer, said insulating layer, said first conductive layer and said tunnel oxide layer of said memory cell region to form a second gate electrode.

2. The method of claim 1, wherein said first conductivity is either of N type conductivity and P type conductivity.

3. The method of claim 1, wherein said tunnel oxide layer comprises silicon dioxide formed by thermal oxidation.

4. The method of claim 1, wherein said first conductive layer comprises polysilicon formed by a low pressure chemical vapor deposition method with $SiH_4$ as a reaction gas at a temperature about 600~650° C.

5. The method of claim 1, wherein said insulating layer is a stacked ONO dielectric layer including an upper silicon dioxide layer, an intermediate silicon nitride layer and a lower silicon dioxide layer.

6. The method of claim 5, wherein said upper silicon dioxide layer of said stacked ONO dielectric layer is formed by a chemical vapor deposition method.

7. The method of claim 5, wherein said intermediate silicon nitride layer of said stacked ONO dielectric layer is formed by a low pressure chemical vapor deposition method with reaction gases of $SiH_2Cl_2$ and $NH_3$ at a temperature about 700~800° C.

8. The method of claim 5, wherein said lower silicon dioxide layer of said stacked ONO dielectric layer is formed by a chemical vapor deposition method.

9. The method of claim 1, wherein said second conductive layer comprises polysilicon formed by a low pressure chemical vapor deposition method with $SiH_4$ as a reaction gas at a temperature about 600~650° C.

10. The method of claim 1, wherein said gate oxide layer comprises silicon dioxide formed by thermal oxidation.

11. The method of claim 1, wherein said third conductive layer comprises polysilicon formed by a low pressure chemical vapor deposition method with $SiH_4$ as a reaction gas at a temperature about 600~650° C.

12. The method of claim 1, wherein said dielectric layer comprises silicon dioxide formed by a low pressure chemical vapor deposition method with a reaction gas of TEOS (tetra-ethyl-ortho-silicate) at a temperature about 650~850° C.

13. A method for fabricating a flash EEPROM cell with a stacked ONO gate dielectric layer, comprising:

providing a semiconductor substrate with a first conductivity;

forming a tunnel oxide layer on said semiconductor substrate;

forming a first polysilicon layer on said tunnel oxide layer;

forming a stacked ONO dielectric layer on said first polysilicon layer by sequentially stacking a first silicon dioxide layer, a silicon nitride layer and a second silicon dioxide layer on said first polysilicon layer;

forming a second polysilicon layer on said stacked ONO dielectric layer;

patterning said second polysilicon layer to form a periphery region on an exposed portion of said semiconductor substrate and a memory cell region on said second polysilicon layer left on said semiconductor substrate;

forming a gate oxide layer on the exposed portion of said semiconductor substrate of said periphery region and on said second polysilicon layer of said memory cell region;

forming a third polysilicon layer on said gate oxide layer;

patterning said third polysilicon layer to form a first gate electrode on said gate oxide layer of said periphery region and expose said gate oxide layer of said memory cell region;

forming a pair of lightly doped drain regions with a second conductivity opposite to said first conductivity beside the sidewall of said first gate electrode in said semiconductor substrate of said periphery region;

forming a silicon dioxide layer on said first gate electrode of said periphery region and on said gate oxide layer of said memory cell region;

anisotropically etching said silicon dioxide layer until exposing said second polysilicon layer of said memory cell region to form a spacer on the sidewall of said first gate electrode of said periphery region;

forming a source/drain region with said second conductivity adjacent to said lightly doped drain region; and patterning said second polysilicon layer, said stacked ONO dielectric layer, said first polysilicon layer and said tunnel oxide layer of said memory cell region to form a second gate electrode.

14. The method of claim 13, wherein said first silicon dioxide layer of said stacked ONO dielectric layer is formed by a chemical vapor deposition method.

15. The method of claim 13, wherein said silicon nitride layer of said stacked ONO dielectric layer is formed by a low pressure chemical vapor deposition method with reaction gases of $SiH_2Cl_2$ and $NH_3$ at a temperature about 700~800° C.

16. The method of claim 13, wherein said second silicon dioxide layer of said stacked ONO dielectric layer is formed by a chemical vapor deposition method.

* * * * *